(12) United States Patent
Jang et al.

(10) Patent No.: US 11,462,545 B2
(45) Date of Patent: Oct. 4, 2022

(54) SEMICONDUCTOR DEVICE AND METHOD FOR FABRICATING THE SAME

(71) Applicant: SK hynix Inc., Gyeonggi-do (KR)

(72) Inventors: Il-Sik Jang, Gyeonggi-do (KR); Ji-Hwan Park, Chungcheongbuk-do (KR); Mi-Ri Lee, Gyeonggi-do (KR); Bong-Seok Jeon, Gyeonggi-do (KR); Yong-Soo Joung, Gyeonggi-do (KR); Sun-Hwan Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 430 days.

(21) Appl. No.: 16/748,370

(22) Filed: Jan. 21, 2020

(65) Prior Publication Data
US 2020/0161307 A1    May 21, 2020

Related U.S. Application Data

(63) Continuation of application No. 15/700,615, filed on Sep. 11, 2017, now Pat. No. 10,559,569.

(30) Foreign Application Priority Data

Dec. 21, 2016 (KR) .......................... 10-2016-0175505

(51) Int. Cl.
*H01L 27/108* (2006.01)
*H01L 21/321* (2006.01)
(Continued)

(52) U.S. Cl.
CPC .... *H01L 27/10852* (2013.01); *H01L 21/3003* (2013.01); *H01L 21/321* (2013.01);
(Continued)

(58) Field of Classification Search
CPC .......... H01L 27/10852; H01L 21/3003; H01L 21/32055; H01L 21/321; H01L 21/32133; H01L 21/3215; H01L 27/10814; H01L 27/10823; H01L 27/10876; H01L 27/10894; H01L 28/75; H01L 21/2236;
(Continued)

(56) References Cited

U.S. PATENT DOCUMENTS 5,413,950 A   5/1995  Chen et al.
6,146,926 A   11/2000 Bhatnagar et al.
(Continued)

FOREIGN PATENT DOCUMENTS

CN   1523679 A   8/2004
CN   1645515 A   7/2005
(Continued)

OTHER PUBLICATIONS

Office Action issued by the Chinese Patent Office dated Apr. 21, 2021.
(Continued)

*Primary Examiner* — Edward Chin
(74) *Attorney, Agent, or Firm* — IP & T Group LLP

(57) ABSTRACT

A method for fabricating a semiconductor device includes: forming a transistor in a semiconductor substrate; forming a capacitor including a hydrogen-containing top electrode over the transistor; and performing an annealing process for hydrogen passivation after the capacitor is formed.

5 Claims, 13 Drawing Sheets

(51) Int. Cl.
  *H01L 21/3215*   (2006.01)
  *H01L 21/3213*   (2006.01)
  *H01L 21/3205*   (2006.01)
  *H01L 21/30*     (2006.01)
  *H01L 21/223*    (2006.01)
  *H01L 49/02*     (2006.01)

(52) U.S. Cl.
  CPC .... *H01L 21/3215* (2013.01); *H01L 21/32055* (2013.01); *H01L 21/32133* (2013.01); *H01L 27/10814* (2013.01); *H01L 27/10823* (2013.01); *H01L 27/10876* (2013.01); *H01L 27/10894* (2013.01); *H01L 28/75* (2013.01); *H01L 21/2236* (2013.01); *H01L 27/10885* (2013.01)

(58) Field of Classification Search
  CPC ............. H01L 27/10885; H01L 21/324; H01L 27/10805; H01L 28/60; H01L 27/10808; H01L 21/02315; H01L 21/28255; H01L 21/76801; H01L 21/76838; H01L 28/82
  See application file for complete search history.

(56) References Cited

U.S. PATENT DOCUMENTS

| | | | |
|---|---|---|---|
| 6,146,962 A | 11/2000 | Kalnitsky et al. | |
| 2004/0178429 A1 | 9/2004 | Tanaka | |
| 2012/0142160 A1 | 6/2012 | Han et al. | |
| 2012/0142177 A1 | 6/2012 | Kim et al. | |
| 2016/0336311 A1* | 11/2016 | Kim | ........................ H01L 28/91 |

FOREIGN PATENT DOCUMENTS

| | | | | |
|---|---|---|---|---|
| CN | 103489831 A | | 1/2014 | |
| CN | 103489831 B | * | 9/2017 | ....... H01L 27/10852 |
| JP | 2015-154028 A | | 8/2015 | |
| JP | 2016134544 A | * | 7/2016 | ......... H01L 31/1876 |
| KR | 10-2011-0107065 A | | 9/2011 | |
| TW | 200307317 A | | 12/2003 | |
| WO | WO-2016019273 A1 | * | 2/2016 | ......... H01L 21/0274 |

OTHER PUBLICATIONS

Office Action issued by the Taiwanese Patent Office dated Nov. 17, 2021.

Office Action issued by the Taiwan Intellectual Property Office dated Jun. 18, 2021.

Office Action issued by the Chinese Patent Office dated Nov. 29, 2021.

* cited by examiner

SEMICONDUCTOR DEVICE AND METHOD FOR FABRICATING THE SAME

CROSS-REFERENCE TO RELATED APPLICATIONS

This application is a continuation of U.S. patent application Ser. No. 15/700,615 filed on Sep. 11, 2017, which claims benefits of priority of Korean Patent Application No. 10-2016-0175505 filed on Dec. 21, 2016. The disclosure of each of the foregoing application is incorporated herein by reference in its entirety.

BACKGROUND

1. Field

Exemplary embodiments of the present invention relate to a semiconductor device and a method for fabricating the semiconductor device, and more particularly, to a semiconductor device including a capacitor and a method for fabricating the semiconductor device.

2. Description of the Related Art

Generally, a plurality of silicon dangling bonds are located at an interface between a silicon substrate and a gate dielectric layer in a Metal Oxide Silicon Field Effect Transistor (MOSFET) type semiconductor device. The silicon dangling bonds may function as interface traps to change a threshold voltage of the MOSFET. A characteristic of the MOSFET may be changed by the threshold voltage variation. Thus, the reliability of a semiconductor device may be degraded.

SUMMARY

Embodiments of the present invention are directed to an improved semiconductor device that is substantially free of silicon dangling bonds, and a method for fabricating the semiconductor device.

Embodiments of the present invention are directed to a semiconductor device which is substantially free of silicon dangling bonds in a memory cell region without deterioration of transistors in a peripheral circuit region, and a method for fabricating the semiconductor device.

In accordance with an embodiment of the present invention, a method for fabricating a semiconductor device includes: forming a transistor in a semiconductor substrate; forming a capacitor including a hydrogen-containing top electrode over the transistor; and performing an annealing process for hydrogen passivation after the capacitor is formed.

The forming of the capacitor may include: forming a bottom electrode; forming a dielectric layer over the bottom electrode; forming a top electrode layer over the dielectric layer; performing a plasma doping process for doping the top electrode layer with hydrogen; and etching the top electrode layer.

The top electrode layer may include a silicon germanium layer.

The bottom electrode may have a pillar shape or a cylindrical shape.

The forming of the capacitor may include: forming a bottom electrode; forming a dielectric layer over the bottom electrode; forming a first top electrode layer over the dielectric layer; forming a second top electrode layer over the first top electrode layer; performing a hydrogen plasma doping process onto the second top electrode layer to form a hydrogen-doped second top electrode layer; forming a third top electrode layer over the hydrogen-doped second top electrode layer; and etching the third top electrode layer, the hydrogen-doped second top electrode layer, and the first top electrode layer to form the hydrogen-containing top electrode.

The second top electrode layer may include a silicon germanium layer.

The first top electrode layer and the third top electrode layer may include a metal-containing layer.

The bottom electrode may have a pillar shape or a cylindrical shape.

The forming of the transistor may include: forming a gate trench in the semiconductor substrate; forming a gate dielectric layer in the gate trench; and forming a gate electrode filling the gate trench over the gate dielectric layer.

The method may further include: forming a bit line after the forming of the transistor before the forming of the capacitor.

The annealing process may be performed in an atmosphere of a hydrogen-containing gas.

In accordance with another embodiment of the present invention, a method for fabricating a semiconductor device includes: preparing a semiconductor substrate including a cell region and a peripheral circuit region; forming a first transistor in the semiconductor substrate of the cell region; forming a second transistor in the semiconductor substrate of the peripheral circuit region; forming a capacitor including a hydrogen-containing top electrode over the first transistor; and performing an annealing process for hydrogen passivation after the capacitor is formed.

The forming of the capacitor may include: forming a bottom electrode; forming a dielectric layer over the bottom electrode; forming a top electrode layer over the dielectric layer; performing a plasma doping process for doping the top electrode layer with hydrogen; and etching the top electrode layer to form the hydrogen-containing top electrode disposed in the cell region.

The top electrode layer may include a silicon germanium layer.

The forming of the capacitor may include: forming a bottom electrode; forming a dielectric layer over the bottom electrode; forming a first top electrode layer over the dielectric layer; forming a second top electrode layer over the first top electrode layer; performing a hydrogen plasma doping process onto the second top electrode layer to a hydrogen-doped second top electrode layer; forming a third top electrode layer over the hydrogen-doped second top electrode layer; and etching the third top electrode layer, the hydrogen-doped second top electrode layer, and the first top electrode layer to form the hydrogen-containing top electrode disposed in the cell region.

The second top electrode layer may include a silicon germanium layer.

The first top electrode layer and the third top electrode layer may include a metal-containing layer.

The forming of the first transistor may include: forming a gate trench in the semiconductor substrate; forming a gate dielectric layer in the gate trench; and forming a gate electrode filling the gate trench over the gate dielectric layer.

The method may further include: forming a bit line after the forming of the first transistor before the forming of the capacitor.

The annealing process may be performed in an atmosphere of a hydrogen-containing gas.

In accordance with yet another embodiment of the present invention, a semiconductor device includes: a semiconductor substrate; a transistor formed in the semiconductor substrate; and a capacitor formed over the transistor, and includes a bottom electrode, a dielectric layer, and a top electrode which are sequentially stacked, wherein the top electrode includes: a first top electrode; a hydrogen-doped second top electrode over the first top electrode; and a third top electrode over the hydrogen-doped second top electrode.

The hydrogen-doped second top electrode may include a hydrogen-doped silicon germanium layer.

The first top electrode and the second top electrode may include a metal-containing material.

The transistor may include: a gate trench formed in the semiconductor substrate; a gate dielectric layer formed in the gate trench; a gate electrode formed over the gate dielectric layer and fills the gate trench; and an interface disposed between the semiconductor substrate and the gate dielectric layer and hydrogen-passivated by the hydrogen-doped second top electrode.

The semiconductor substrate may include a cell region and a peripheral circuit region, and the hydrogen-doped second top electrode is disposed in the cell region and does not cover the peripheral circuit region.

In accordance with still another embodiment of the present invention, a method for fabricating a semiconductor device includes: forming a semiconductor structure including an interface between a first material and a second material; forming a silicon germanium layer over the semiconductor structure; performing a hydrogen plasma doping process onto the silicon germanium layer to form a hydrogen-doped silicon germanium layer; and diffusing hydrogen from the hydrogen-doped silicon germanium layer to passivate the interface.

The diffusing of the hydrogen may include: performing an annealing process in an atmosphere of a hydrogen-containing gas.

The forming of the semiconductor structure may include: forming a dielectric layer over a semiconductor material, and in the diffusing of the hydrogen passivates a dangling bond in the interface between the semiconductor material and the dielectric layer.

The forming of the semiconductor structure may include: forming a gate dielectric layer over a silicon substrate; and forming a gate electrode over the gate dielectric layer, wherein in the diffusing of the hydrogen passivates a silicon dangling bond in the interface between the silicon substrate and the gate dielectric layer.

DETAILED DESCRIPTION

Figure 1:
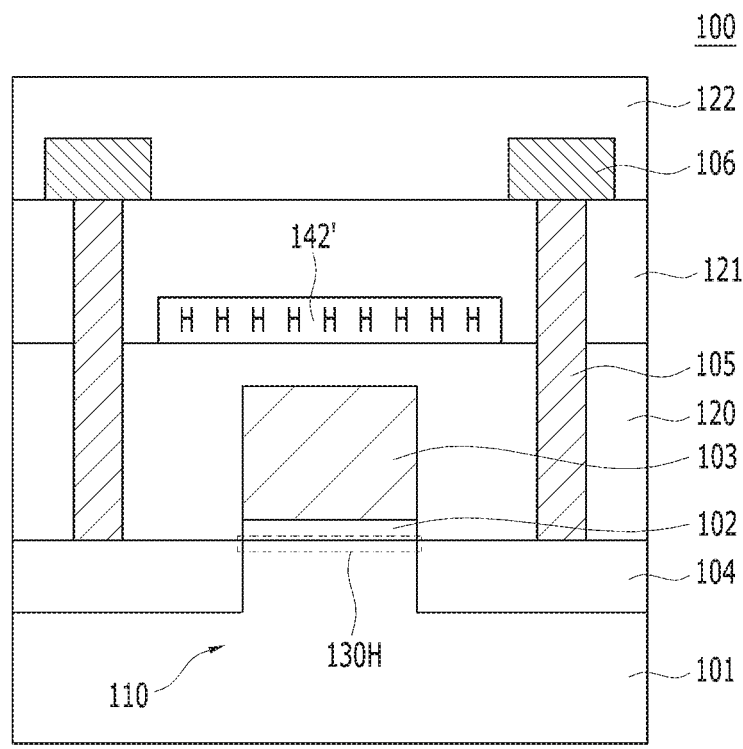
FIG. 1 is a cross-sectional view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device 100 in accordance with a first embodiment of the present invention.

Referring to FIG. 1, the semiconductor device 100 may include a transistor 110, and a hydrogen supplying layer 142' formed over the transistor 110. The transistor 110 may include a substrate 101, a gate dielectric layer 102 disposed over the substrate 101, a gate electrode 103 disposed over the gate dielectric layer 102, a source/drain region 104 formed in the substrate 101. A first inter-layer dielectric layer 120 may be formed between the transistor 110 and the hydrogen supplying layer 142'. The semiconductor device 100 may further include a second inter-layer dielectric layer 121 covering the hydrogen supplying layer 142' and the first inter-layer dielectric layer 120, and a third inter-layer dielectric layer 122 disposed over the second inter-layer dielectric layer 121. Also, the semiconductor device 100 may further include a metal line 106 contacting the source/drain region 104 of the transistor 110 via contact plug 105 formed between the metal line 106 and the source/drain region 104.

The semiconductor device 100 of FIG. 1 may be obtained after a hydrogen passivation process is performed. For example, a hydrogen-passivated interface 130H may be formed between the gate dielectric layer 102 and the substrate 101. The hydrogen-passivated interface 130H may be passivated by hydrogen diffused from the hydrogen supplying layer 142'.

FIGS. 2A to 2E are cross-sectional views illustrating a method for fabricating the semiconductor device of FIG. 1, in accordance with the first embodiment of the present invention.

Figure 2A:
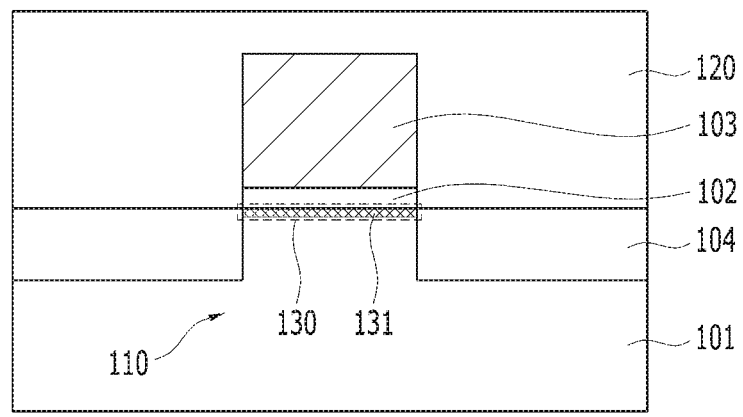
FIGS. 2A to 2E are cross-sectional views illustrating a method for fabricating the semiconductor device in accordance with the first embodiment of the present invention.

Referring to FIG. 2A, the transistor 110 may be formed in the substrate 101. The transistor 110 may include the substrate 101, the gate dielectric layer 102 disposed over a top surface of the substrate 101, the gate electrode 103 disposed over the gate dielectric layer 102, and the source/drain region 104 formed in the substrate 101 on both sidewalls of the gate electrode 103. The first inter-layer dielectric layer 120 may be formed over the transistor 110. An interface 130 may be formed between the gate dielectric layer 102 and the substrate 101. The substrate 101 may include a silicon-based semiconductor substrate. Therefore, the interface 130 may be an interface between a dielectric material and a semiconductor material or an interface between a dielectric material and a silicon material. The interface 130 may be a non-passivated interface having a plurality of silicon dangling bonds 131.

Figure 2B:
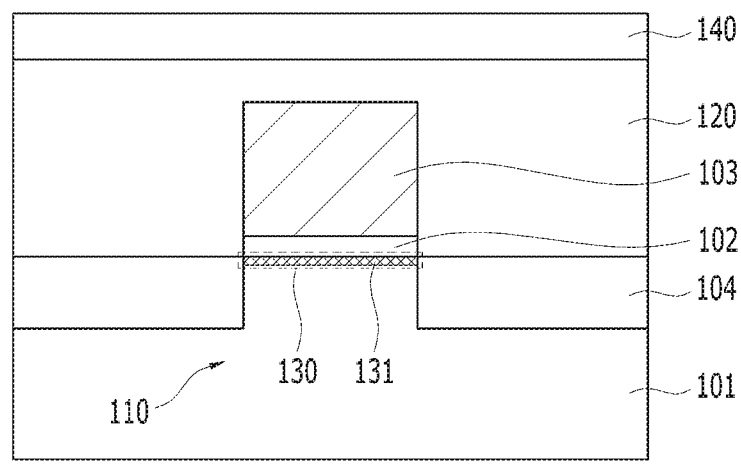

Referring to FIG. 2B, a conductive layer 140 may be formed over the first inter-layer dielectric layer 120. The conductive layer 140 may include a silicon-containing material. For example, the conductive layer 140 may include a silicon germanium layer. The conductive layer 140 may include a silicon germanium layer doped with an impurity. The conductive layer 140 may include a silicon germanium layer doped with boron.

Figure 2C:
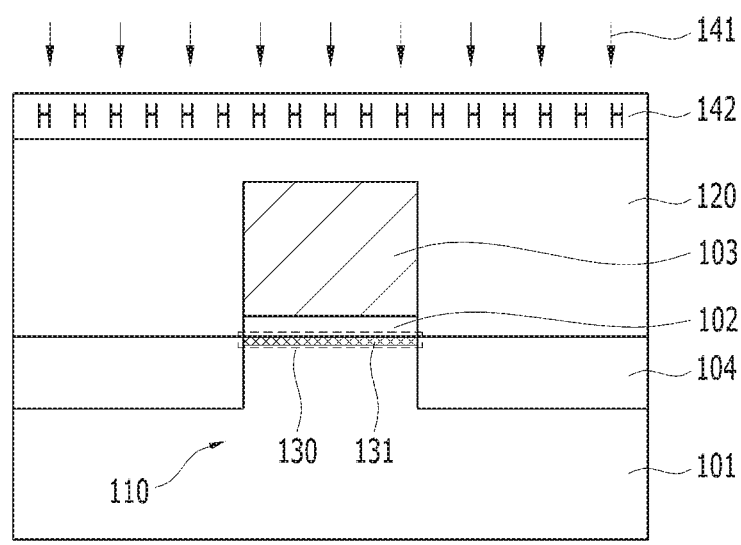

Referring to FIG. 2C, a hydrogen plasma doping process 141 may be performed onto the conductive layer 140 to form a hydrogen-doped conductive layer 142. The hydrogen plasma doping process 141 may use a hydrogen compound as a doping gas. For example, hydrogen ($H_2$) may be doped by a dose of approximately $3\times10^{16}$ atoms/cm$^2$ using an energy of approximately 3 KeV.

Figure 2D:
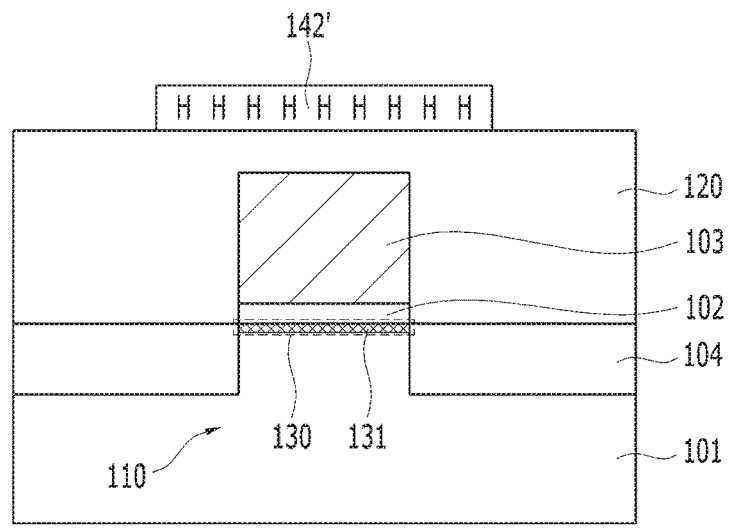

Referring to FIG. 2D, the hydrogen-doped conductive layer 142 may be patterned to form the hydrogen supplying layer 142'. The hydrogen supplying layer 142' may be overlap with the gate electrode 103.

Figure 2E:
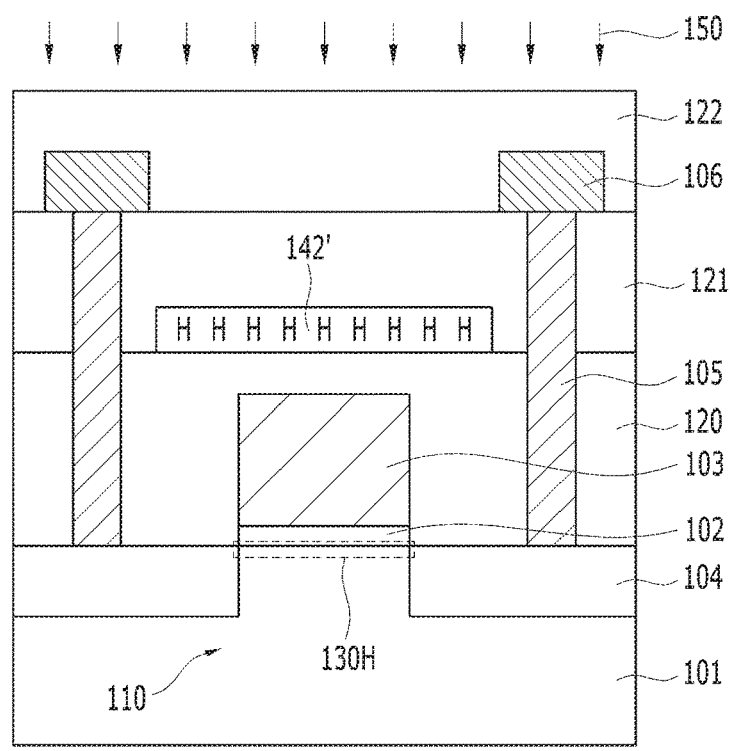

Referring to FIG. 2E, a hydrogen passivation process 150 may be performed. The hydrogen passivation process 150 may be performed in the atmosphere of a hydrogen-containing gas. The hydrogen passivation process 150 may include an annealing process. The hydrogen passivation process 150 may be performed in the atmosphere of $H_2N_2$. Before the hydrogen passivation process 150 is performed, a second inter-layer dielectric layer 121 may be further formed. The second inter-layer dielectric layer 121 may include a silicon oxide, such as TENS (Tetraethyl Orthosilicate). The second inter-layer dielectric layer 121 may cover the hydrogen supplying layer 142' and the exposed top surface of the first interlayer dielectric layer 120. After the second inter-layer dielectric layer 121 is formed and before the hydrogen passivation process 150 is performed, the third inter-layer dielectric layer 122 and the metal line 106 may be formed. The metal line 106 may be coupled to the source/drain region 104 of the transistor through the contact plug 105.

Through the hydrogen passivation process 150, the hydrogen in a $H_2N_2$ atmosphere may remove the silicon dangling bonds 131 on surface of the substrate 101. Hydrogen may also be diffused from the hydrogen supplying layer 142' to further remove the silicon dangling bonds 131 on the surface of the substrate 101 in the interface between the substrate 101 and the gate dielectric layer 102. The interface 130 may be passivated with hydrogen thus forming the hydrogen-passivated interface 130H between the gate dielectric layer 102 and the substrate 101. The hydrogen passivated interface 130H may include hydrogen-silicon bonds. The hydrogen-silicon bonds that are created by the hydrogen passivation process 150.

As described above, according to an embodiment of the present invention, the efficiency of the hydrogen passivation may be increased more by forming the hydrogen supplying layer 142' than a case where the hydrogen passivation process 150 alone is performed. Also, by employing the hydrogen supplying layer 142', the time and temperature for performing the hydrogen passivation process 150 may be decreased.

According to another embodiment of the present invention, the conductive layer 140 may include a plurality of conductive material layers. For example, the conductive layer 140 may include a first metal-containing layer, a silicon germanium layer, and a second metal-containing layer, which are stacked sequentially. In the first place, the first metal-containing layer and the silicon germanium layer may be stacked, and subsequently, a silicon plasma doping process may be performed onto the silicon germanium layer. Subsequently, the second metal-containing layer may be formed and then a patterning may be performed. As a result, a conductive layer including a hydrogen-doped silicon germanium layer disposed between the first metal-containing layer and the second metal-containing layer may be formed.

Figure 3A:
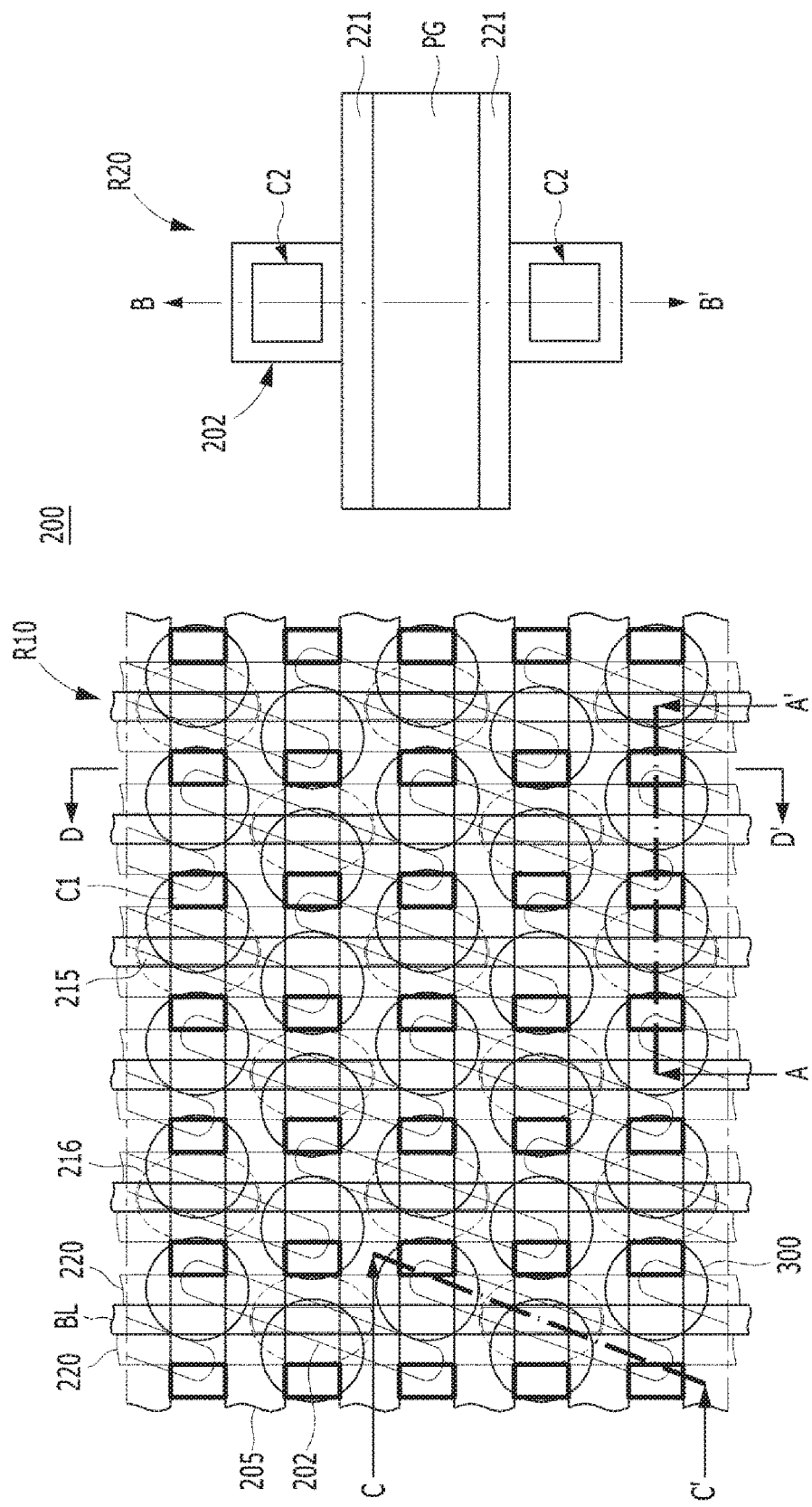
FIG. 3A illustrates a semiconductor device in accordance with a second embodiment of the present invention.
Figure 3B:
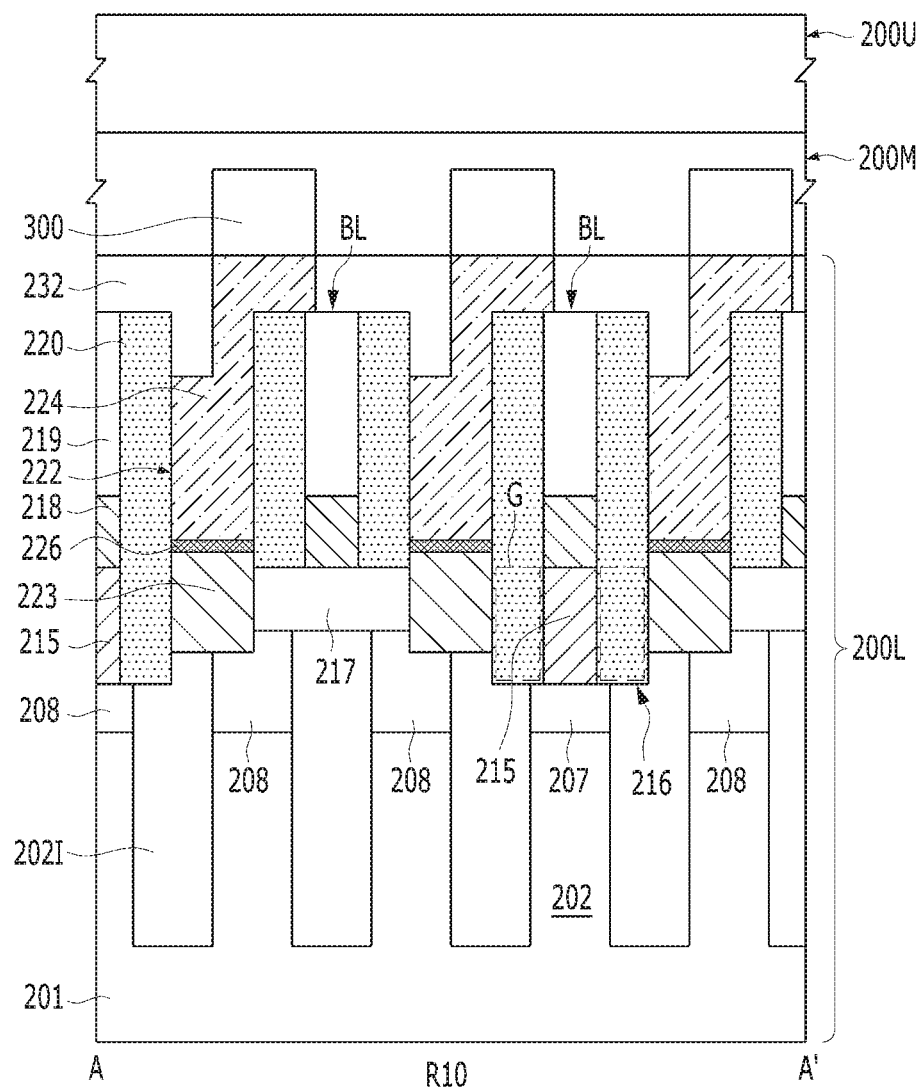
FIG. 3B is a cross-sectional view of the semiconductor device of FIG. 3A taken along a line A-A'.
Figure 3C:
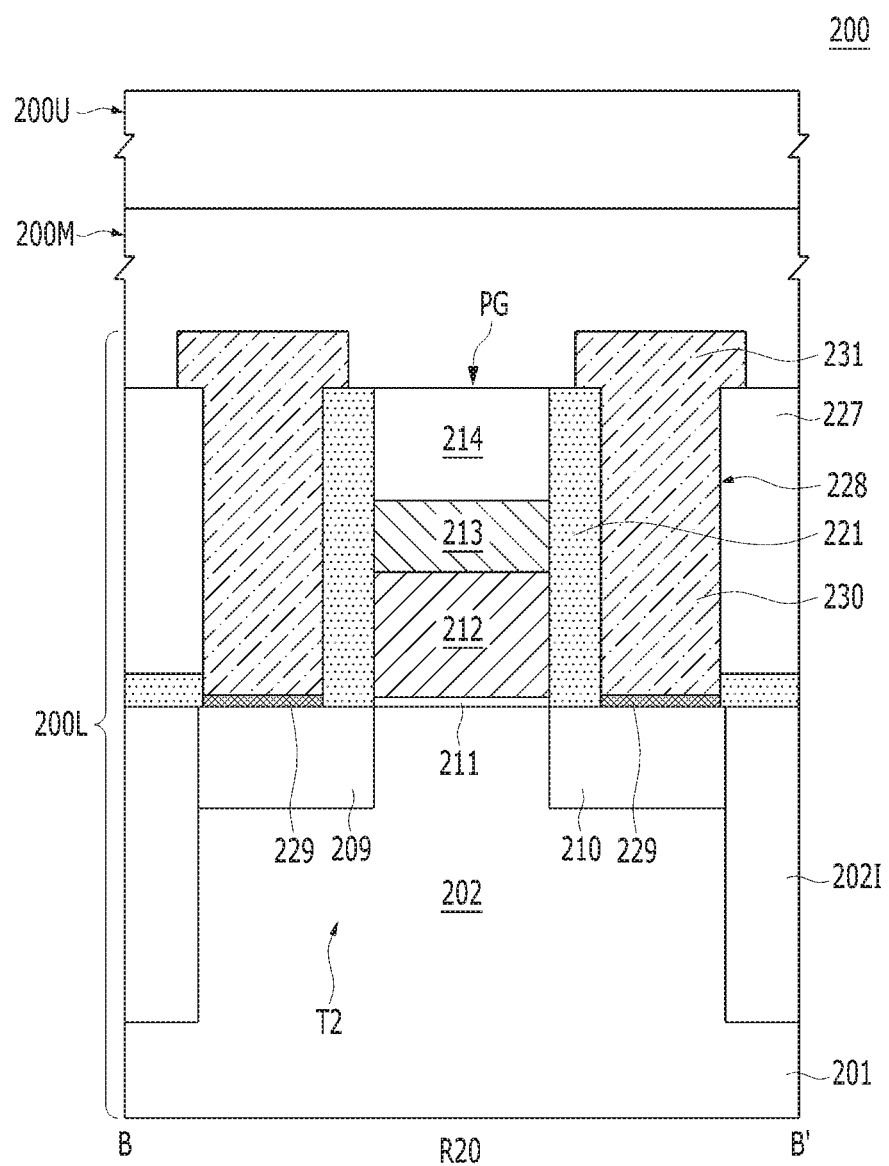
FIG. 3C is a cross-sectional view of the semiconductor device of FIG. 3A taken along a line B-B'.
Figure 3D:
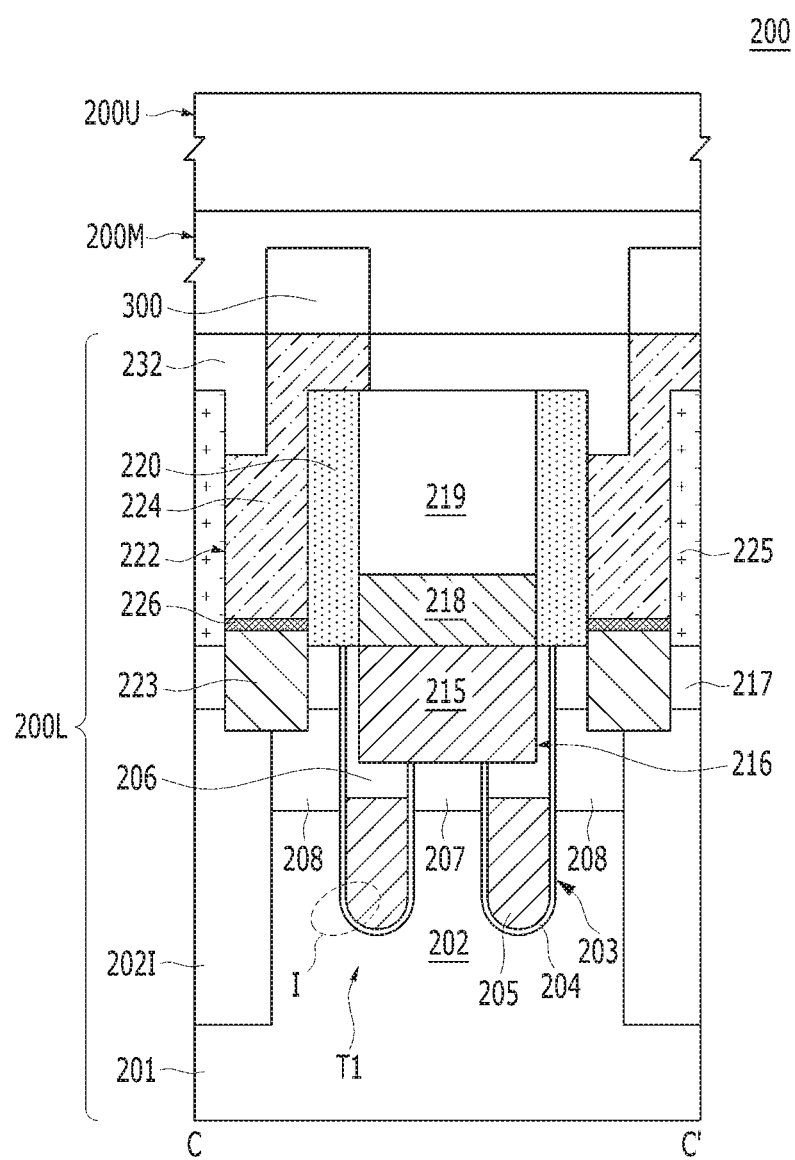
FIG. 3D is a cross-sectional view of the semiconductor device of FIG. 3A taken along a line C-C'.

FIGS. 3A to 3D illustrate a semiconductor device in accordance with a second embodiment of the present invention. In the second embodiment of the present invention, a semiconductor device having memory cells such as those of a Dynamic Random Access Memory (DRAM) is described. FIG. 3A is a plan view of the semiconductor device in accordance with the second embodiment of the present invention. FIG. 3B is a cross-sectional view of the semiconductor device of FIG. 3A taken along a line A-A'. FIG. 3C is a cross-sectional view of the semiconductor device of FIG. 3A taken along a line B-B'. FIG. 3D is a cross-sectional view of the semiconductor device of FIG. 3A taken along a line C-C'.

The semiconductor device 200 may include a cell region R10 and a peripheral circuit region R20. A plurality of memory cells may be formed in the cell region R10. Each of the memory cells may include a cell transistor T1 including a buried word line 205, a bit line 218, and a memory element 300. In the peripheral circuit region R20, a transistor forming a peripheral circuit (which is simply referred to as 'a peripheral transistor', hereafter) may be formed. The peripheral transistor T2 may include a peripheral gate structure PG.

The semiconductor device 200 may include a lower structure 200L, a middle structure 200M, and an upper structure 200U, which are stacked sequentially. The lower structure 200L may include the cell transistor T1 and the bit line 218. The middle structure 200M may include the memory element 300. The upper structure 200U may include a plurality of metal line layers.

Hereafter, the semiconductor device 200 is described in detail.

An isolation layer 202I and an active region 202 may be formed in a substrate 201. The isolation layer 202I may isolate the cell region R10 and the peripheral circuit region R20 from each other. The substrate 201 may be formed of a material appropriate for semiconductor processing. The substrate 201 may include a semiconductor substrate. The substrate 201 may be formed of a silicon-containing material. The substrate 201 may include any suitable semiconductor material selected from a group including silicon, monocrystalline silicon, polycrystalline silicon, amorphous silicon, silicon germanium, monocrystalline silicon germanium, polycrystalline silicon germanium, carbon-doped silicon, combinations thereof, and multiple layers thereof. The substrate 201 may include other semiconductor material, such as germanium. The substrate 201 may include a semiconductor substrate of a III/V-group material. For example, the substrate 201 may include a chemical compound semiconductor substrate, such as GaAs. The substrate 201 may include a Silicon-On-Insulator (SOI) substrate. The isolation layer 202I may be formed through a Shallow Trench Isolation (STI) process. The isolation layer 202I may define a plurality of active regions 202 in each of the cell region R10 and the peripheral circuit region R20.

A gate trench 203 may be formed in the cell region R10. A first gate dielectric layer 204 may be formed on a surface of the gate trench 203. The buried word line 205 that fills a portion of the gate trench 203 may be formed over the first gate dielectric layer 204. A sealing layer 206 may be formed over the buried word line 205. The sealing layer 206 may be as high as a surface of the substrate 201. The buried word line 205 may be positioned at a lower level than the level of the surface of the substrate 201. The buried word line 205 may be a low-resistance material. For example, the buried word line 205 may be at least one of a metal nitride or metal. In an embodiment, the buried word line 205 may include titanium nitride and tungsten, which are stacked sequentially.

In the substrate 201 of the cell region R10, a first source/drain region 207 and a second source/drain region 208 may be formed. The first source/drain region 207 and the second source/drain region 208 may be spaced apart from each other by the gate trench 203. As a result, the buried word line 205, the first source/drain region 207, and the second source/drain region 208 may form the cell transistor T1. A short-channel effect of the cell transistor T1 is improved due to the presence of the buried word line 205.

In the substrate 201 of the peripheral circuit region R20, a third source/drain region 209 and a fourth source/drain region 210 may be formed. Each of the third source/drain region 209 and the fourth source/drain region 210 may include a low concentration source/drain region and a high concentration source/drain region. A peripheral gate structure PG may be formed over the substrate 201 between the third source/drain region 209 and the fourth source/drain region 210. The peripheral gate structure PG may include a second gate dielectric layer 211, a silicon electrode 212, a metal electrode 213, and a gate capping layer 214. As a result, the peripheral transistor T2 including the peripheral gate structure PG, the third source/drain region 209, and the fourth source/drain region 210 may be formed.

A bit line contact plug 215 may be formed over the substrate 201 of the cell region R10. The bit line contact plug 215 may be coupled to the first source/drain region 207. The bit line contact plug 215 may be disposed in the inside of a bit line contact hole 216. The bit line contact hole 216 may be formed in a hard mask layer 217. The hard mask layer 217 may be formed over the substrate 201. The bit line contact hole 216 may expose the first source/drain region 207. A bottom surface of the bit line contact plug 215 may be lower than the top surface of the substrate 201. The bit line contact plug 215 may be formed of polysilicon or a metal material. A portion of the bit line contact plug 215 may have a shorter line width than a diameter of the bit line contact hole 216. Therefore, gaps G may be formed on both sides of the bit line contact plug 215. The gaps G may be independently formed on both sides of the bit line contact plug 215. After all, one bit line contact plug 215 and a pair of gaps G may be disposed in the inside of the bit line contact hole 216. The pair of gaps G may be isolated by the bit line contact plug 215. The gap G may be positioned between the bit line contact plug 215 and a silicon plug 223.

A bit line structure BL may be formed over the bit line contact plug 215. The bit line structure BL may include a bit line 218 and a bit line capping layer 219 over the bit line 218. The bit line structure BL may have a shape of a line that is extended in a direction intersecting with the buried word line 205. A portion of the bit line 218 may be coupled with the bit line contact plug 215. When viewed from the direction of the line A-A', the bit line 218 and the bit line contact plug 215 may have the same line width. Therefore, the bit line 218 may be extended in any one direction while covering the bit line contact plug 215. The bit line 218 may include a metal material. The bit line capping layer 219 may include a dielectric material. The bit line structure BL and the peripheral gate structure PG may be simultaneously formed of the same material.

A first spacer element 220 may be formed on a sidewall of the bit line structure BL. A second spacer element 221 may be formed on a sidewall of the peripheral gate structure PG. Each of the first spacer element 220 and the second spacer element 221 may be formed of a plurality of spacers. The bottom surface of the first spacer element 220 may fill the gaps G on both sides of the bit line contact plug 215.

A cell contact structure C1 may be formed between the two neighboring bit line structures BL. The cell contact structure C1 may be formed in a storage node contact hole 222. The cell contact structure C1 may be coupled to the second source/drain region 208. The cell contact structure C1 may include the silicon plug 223 and a metallic plug 224. The upper portion of the metallic plug 224 may be extended to partially overlap with the top surface of the bit line structure BL. The metallic plug 224 may be disposed adjacent to the bit line 218. The silicon plug 223 may be disposed adjacent to the bit line contact plug 215. When viewed from the direction of the line D-D', a plug isolation layer 225 may be formed between the two neighboring cell contact structures C1. The plug isolation layer 225 may be formed between the two neighboring bit line structures BL. The storage node contact hole 222 is formed in the hard mask layer 217 and the plug isolation layer stack.

The cell contact structure C1 may further include a first metal silicide 226 between the silicon plug 223 and the metallic plug 224. The silicon plug 223 may include a doped polysilicon, and the metallic plug 224 may include tungsten. The first metal silicide 226 may be an ohmic contact layer, and a contact resistance may be decreased by the first metal silicide 226. The first metal silicide 226 may include a cobalt silicide. The cell contact structure C1 may be referred to as 'a storage node contact plug'.

In the peripheral circuit region R20, a peripheral contact structure C2 may be formed. The peripheral contact structure C2 may fill an M1 contact hole 228 formed in the inside of an inter-layer dielectric layer 227. The M1 contact hole 228 may refer to a contact hole to be filled with a first metal plug 230. The peripheral contact structure C2 may include a second metal silicide 229 and the first metal plug 230. The second metal silicide 229 and the first metal silicide 226 may be formed simultaneously. The first metal line 231 may be formed over the peripheral contact structure C2. The first metal plug 230, the first metal line 231, and the metallic plug 224 may be simultaneously formed using the same material.

A capping layer 232 may be formed between the upper portion of the metallic plug 224 and the upper portion of the bit line structure BL.

As described above, the lower structure 200L may include the substrate 201, the cell transistor T1, the peripheral transistor T2, the bit line 218, the cell contact structure C1, the peripheral contact structure C2, and the first metal line 231.

The middle structure 200M including the memory element 300 may be formed over the lower structure 200L. The upper structure 200U may be formed over the middle structure 200M.

Figure 4:
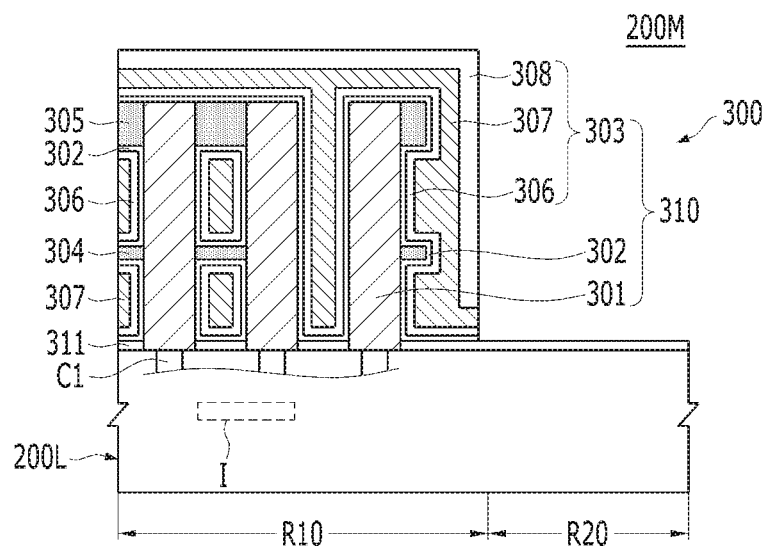
FIG. 4 is a cross-sectional view of a middle structure 200M.

FIG. 4 is a cross-sectional view of the middle structure 200M. Referring to FIG. 4, the middle structure 200M may include the memory element 300, and the memory element 300 may include a capacitor 310. The lowest layer of the middle structure 200M may include an etch stop layer 311. The etch stop layer 311 may cover the cell region R10 and the peripheral circuit region R20, while exposing the upper surface of the cell contact structure C1, which is the highest layer of the lower structure 200L. The capacitor 310 may be formed over the cell contact structure C1.

The capacitor 310 may include a plurality of bottom electrodes 301. A dielectric layer 302 and a top electrode 303 may be sequentially stacked over the bottom electrodes 301. Each of the bottom electrodes 301 may be of a pillar type. The bottom electrodes 301 may be of a cylindrical shape, other than the pillar type. The bottom electrodes 301 may be referred to as storage nodes. The bottom electrodes 301 may be coupled to the cell contact structure C1. The bottom electrodes 301 may include a metal material. The bottom electrodes 301 may include a titanium nitride. The neighboring bottom electrodes 301 may be laterally supported by a first supporter 304 and a second supporter 305. The lowest portions of the bottom electrodes 301 may be laterally supported by the etch stop layer 311.

The top electrode 303 may include a first top electrode 306, a hydrogen-doped second top electrode 307, and a third top electrode 308. The hydrogen-doped second top electrode 307 may be disposed between the first top electrode 306 and the third top electrode 308. The hydrogen-doped second top electrode 307 may include a hydrogen-doped silicon germanium layer. Hydrogen doped into the hydrogen-doped silicon germanium layer may be doped through a plasma doping process. The first top electrode 306 and the third top electrode 308 may include a metal-containing layer. The third top electrode 308 may be of a material having a lower resistance than the first top electrode 306. For example, the first top electrode 306 may be of a titanium nitride, and the third top electrode 308 may include a tungsten nitride and tungsten, which are stacked sequentially. The tungsten nitride may be an adhesive layer and an anti-diffusion layer between the tungsten and the hydrogen-doped second top electrode 307.

Figure 5:
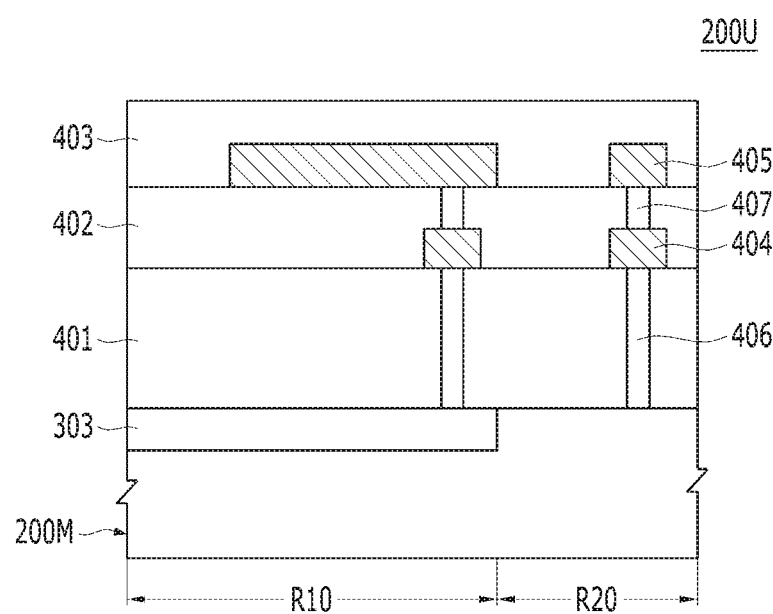
FIG. 5 is a cross-sectional view of an upper structure 200U.

FIG. 5 is a cross-sectional view of the upper structure 200U. Referring to FIG. 5, the upper structure 200U may include multiple layers consisting of metal lines 404 and 405. A plurality of metal inter-layer dielectric layers 401, 402 and 403 and a plurality of metal lines 404 and 405 may be formed over the capacitor 310. Herein, the metal lines 404 and 405 may include a second metal line 404 and a third metal line 405. The first metal inter-layer dielectric layer 401 may cover the capacitor 310 and the peripheral circuit region R20. The second metal inter-layer dielectric layer 402 may cover the second metal line 404 and the first metal inter-layer dielectric layer 401. The third metal inter-layer dielectric layer 403 may cover the third metal line 405 and the second metal inter-layer dielectric layer 402. The upper structure 200U may further include a first via plug 406 and a second via plug 407. The first via plug 406 may couple the top electrode 303 and the second metal line 404 to each other. The second via plug 407 may couple the second metal line 404 and the third metal line 405 to each other. The metal inter-layer dielectric layers 401, 402 and 403 may be formed of a silicon oxide. The metal lines 404 and 405 and the first and second via plugs 406 and 407 may include tungsten, copper, aluminum, or a combination thereof.

The semiconductor device 200 described above may be a Dynamic Random Access Memory (DRAM) device. The semiconductor device 200 may include an interface between two materials. For example, the semiconductor device 200 may include an interface I between the first gate dielectric layer 204 and the substrate 201. (See FIG. 3D). The interface I may be a hydrogen-passivated interface. In other words, the interface I may be passivated by hydrogen diffused from the hydrogen-doped second top electrode 307. Also, the interface I may be passivated by hydrogen through a hydrogen passivation process able to be performed after the third metal inter-layer dielectric layer 403 is formed, e.g., an annealing process performed in the atmosphere of a hydrogen-containing gas.

FIGS. 6A to 6J are cross-sectional views illustrating a method for fabricating the semiconductor device in accordance with the second embodiment of the present invention. In a DRAM device, a peripheral circuit region for controlling data input and output to/from a memory cell may be generally provided, other than a cell region where memory cells are formed. When a plurality of constituent elements are formed in the cell region and the peripheral circuit region, some of the constituent elements may be formed to be concurrently merged.

Hereafter, for the sake of convenience in description, since the lower structure 200L disposed in the lower portion of the capacitor 310 among the constituent elements of the semiconductor device 200 shown in FIG. 3B may be manufactured by a well-known method, detailed explanation thereof will be omitted. The lower structure 200L may include an unpassivated interface I' between the first gate dielectric layer 204 (see FIG. 3B) and the substrate 201 (see FIG. 3B). Herein, the unpassivated interface I' may be an interface made before a hydrogen-passivation process is performed. Therefore, the unpassivated interface I' may include silicon dangling bonds DB generated through a series of processes for forming the lower structure 200L.

Figure 6A:
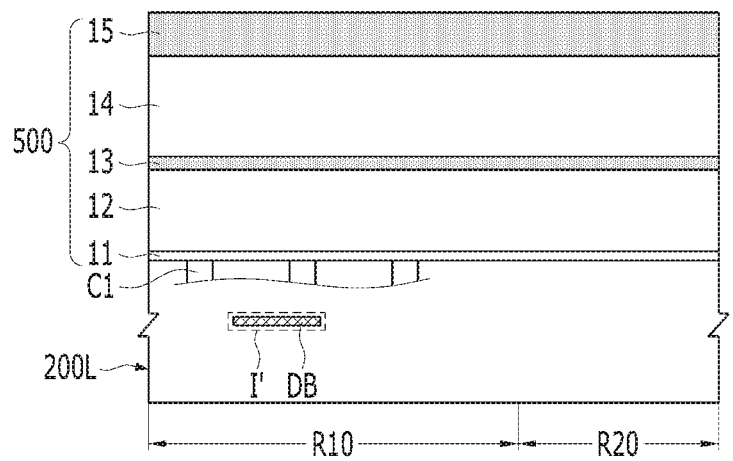
FIGS. 6A to 6J are cross-sectional views illustrating a method for fabricating the semiconductor device, in accordance with the second embodiment of the present invention.

Referring to FIG. 6A, a lower structure 200L may be formed. The lower structure 200L may include a cell region R10 where memory cells are disposed and a peripheral circuit region R20 where peripheral circuits controlling the memory cells are disposed.

The lower structure 200L may include the unpassivated interface I'. The lower structure 200L may include a cell contact structure C1. The constituent elements of the lower structure 200L may be understood by referring to FIGS. 3A to 3D. The cell contact structure C1 may be formed in the cell region R10.

Subsequently, a mold structure 500 may be formed over the lower structure 200L. The mold structure 500 may include an etch stop layer 11, a first mold layer 12, a first supporting layer 13, a second mold layer 14, and a second supporting layer 15. The first mold layer 12 and the second mold layer 14 may include a silicon oxide. The first mold layer 12 may be formed thicker than the second mold layer 14. The first mold layer 12 and the second mold layer 14 may be formed of different silicon oxides. The mold structure 500 may be formed in the cell region R10 and the peripheral circuit region R20.

The etch stop layer 11 may be formed of a material having an etch selectivity with respect to the first mold layer 12. The etch stop layer 11 may include a silicon nitride.

The first supporting layer 13 and the second supporting layer 15 may be formed of a material having an etch selectivity with respect to the first mold layer 12 and the second mold layer 14. The first supporting layer 13 and the second supporting layer 15 may be formed of a silicon nitride or a silicon carbon nitride (SiCN). The second supporting layer 15 may be formed thicker than the first supporting layer 13.

Figure 6B:
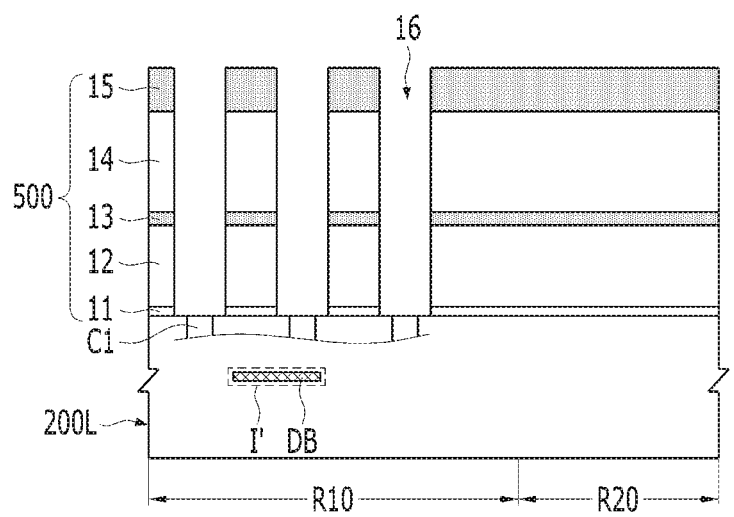

Referring to FIG. 6B, a plurality of openings 16 may be formed by etching the mold structure 500. The openings 16 may be formed by sequentially etching the second supporting layer 15, the second mold layer 14, the first supporting layer 13, and the first mold layer 12. The etch process that is performed to form the openings 16 may stop at the etch stop layer 11. The openings 16 may be formed in the cell region R10. The openings 16 may be referred to as holes where bottom electrodes are to be formed.

Subsequently, the upper surface of the cell contact structure C1 below the openings 16 may be exposed by etching the etch stop layer 11.

Figure 6C:
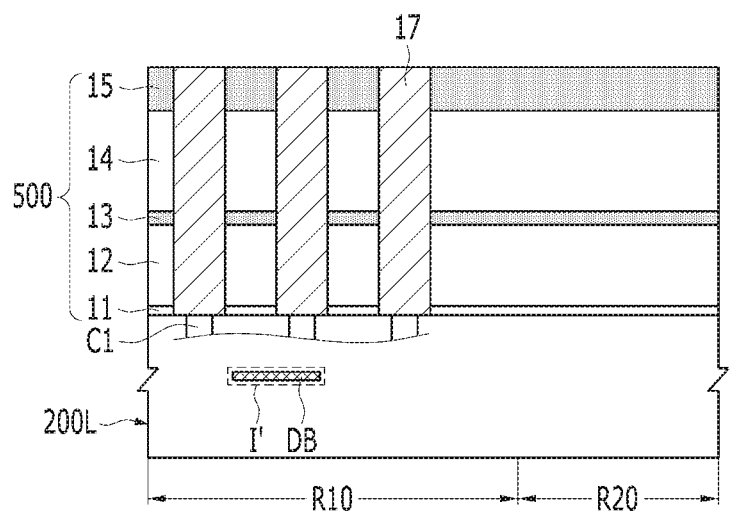

Referring to FIG. 6C, bottom electrodes 17 may be formed in the openings 16. The bottom electrodes 17 may fill the openings 16. Therefore, the bottom electrodes 17 may be called 'pillar-type bottom electrodes'. To form the bottom electrodes 17, a bottom electrode layer (not shown) filling the openings 16 may be formed. To form the bottom electrode layer in the openings 16 having a high aspect ratio, a film-forming technology (e.g., Chemical Vapor Deposition (CVD) or Atomic Layer Deposition (ALD)) having an excellent property of step coverage may be used. The bottom electrodes 17 then may be formed in the openings 16 by performing a planarization process onto the bottom electrode layer. The planarization process may be a Chemical Mechanical Polishing (CMP) process or an etch-back process. The bottom electrodes 17 may include at least one selected from a group including titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide (RuO$_2$), iridium (Ir), an iridium oxide (IrO$_2$), platinum (Pt), and a combination thereof. In the present embodiment, the bottom electrodes 17 may include a titanium nitride (TiN). In the present embodiment, the bottom electrodes 17 may include a titanium nitride (ALD-TiN) that is formed through an ALD process.

Although the bottom electrodes 17 are illustrated in a pillar type, the bottom electrodes 17 may be formed in diverse types, such as a stack type or a cylindrical type.

Figure 6D:
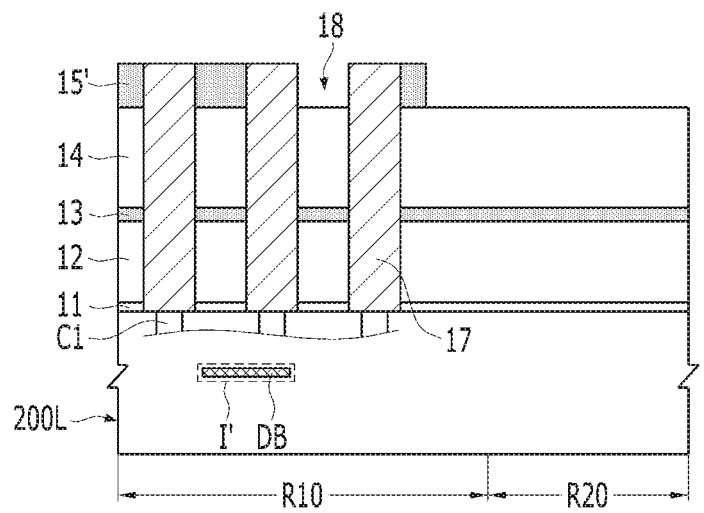
Figure 6E:
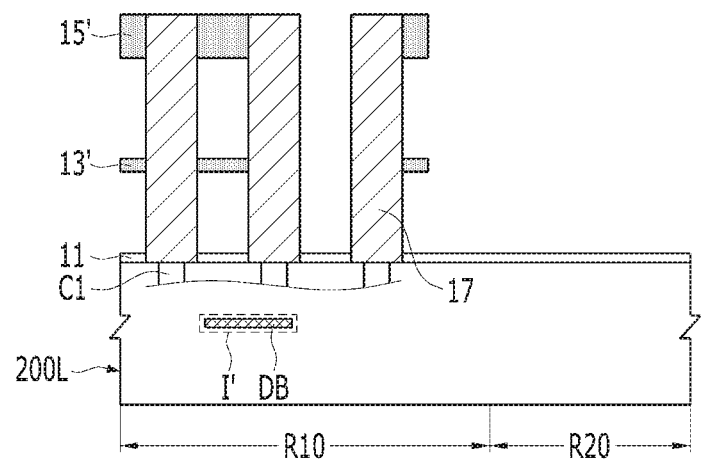

Referring to FIGS. 6D and 6E, a second supporter 15' and a first supporter 13' may be formed. The second supporter 15' and the first supporter 13' may be formed by selectively etching the second supporting layer 15 and the first supporting layer 13. For example, a supporter opening 18 and the second supporter 15' may be formed by selectively etching the second supporting layer 15, and the second mold layer 14 may be removed through the supporter opening 18. Subsequently, the first supporter 13' is formed by selectively etching the first supporting layer 13, and removing the first mold layer 12. The second mold layer 14 and the first mold layer 12 may be removed through a wet dip-out process. The second supporter 15' may be formed on one sidewall of one bottom electrode 17 to contact one sidewall of another neighboring bottom electrode 17. Therefore, the second supporter 15' may laterally support the upper regions of the neighboring bottom electrodes 17. The first supporter 13' may be formed on one sidewall of the bottom electrode 17 to contact one sidewall of another neighboring bottom electrode 17. Therefore, the first supporter 13' may laterally support the lower regions of the neighboring bottom electrodes 17. The first mold layer 12 and the second mold layer 14 may be removed to expose the etch stop layer 11.

The second supporting layer 15, the second mold layer 14, the first supporting layer 13, and the first mold layer 12, all of which are formed over the lower structure 200L of the peripheral circuit region R20 may be completely removed. As a result, the etch stop layer 11 over the lower structure 200L of the peripheral circuit region R20 may be exposed. The etch stop layer 11 may cover the cell region R10 and the peripheral circuit region R20. The etch stop layer 11 may expose the upper surface of the cell contact structure C1.

Figure 6F:
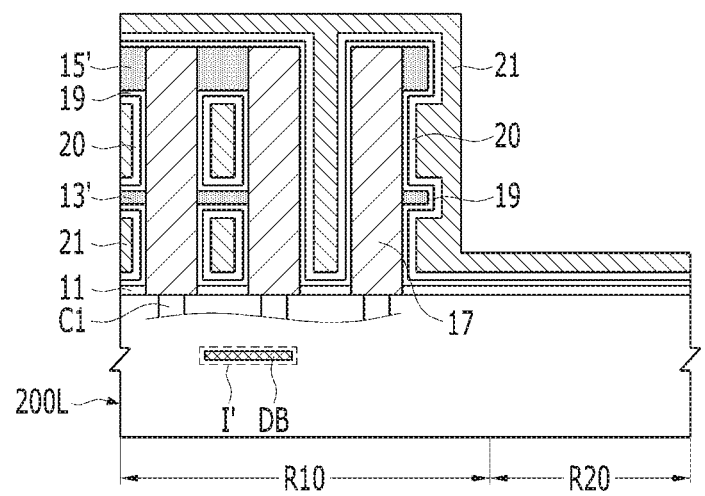

Referring to FIG. 6F, a dielectric layer 19 may be formed. The dielectric layer 19 may be formed in the cell region R10 and the peripheral circuit region R20. The dielectric layer 19 may be formed to conformally cover the first supporter 13', the second supporter 15', the bottom electrodes 17, and the upper surface of the etch stop layer 11. The dielectric layer 19 may cover the upper surface of the etch stop layer 11 formed over the peripheral circuit region R20. To be specific, the dielectric layer 19 may be formed by supplying a source material through the supporter opening 18.

The dielectric layer 19 may include a high-k material whose dielectric rate is higher than that of a silicon oxide. The high-k material may include a hafnium oxide (HfO$_2$), a zirconium oxide (ZrO$_2$), an aluminum oxide (Al$_2$O$_3$), a titanium oxide (TiO$_2$), a tantalum oxide (Ta$_2$O$_5$), a niobium oxide (Nb$_2$O$_5$), or a strontium titanium oxide (SrTiO$_3$). According to another embodiment of the present invention, the dielectric layer 19 may be formed of a composite layer that includes two or more layers of the aforementioned high-k material.

In this embodiment of the present invention, the dielectric layer 19 may be formed of a zirconium oxide-based material having excellent leakage current characteristics while sufficiently decreasing an equivalent oxide thickness (EOT). For example, the dielectric layer 19 may include ZAZ (ZrO$_2$/Al$_2$O$_3$/ZrO$_2$), TZ (TiO$_2$/ZrO$_2$), ZAZT (ZrO$_2$/Al$_2$O$_3$/ZrO$_2$/TiO$_2$), TZAZT (TiO$_2$/ZrO$_2$/Al$_2$O$_3$/ZrO$_2$/TiO$_2$), or ZAZAT (ZrO$_2$/Al$_2$O$_3$/ZrO$_2$/Al$_2$O$_3$/TiO$_2$). In the TZ, ZAZT, TZAZT, and ZAZAT, the titanium oxide (TiO$_2$) may be replaced with a tantalum oxide (Ta$_2$O$_5$).

The dielectric layer 19 may be formed through a Chemical Vapor Deposition (CVD) process or an Atomic Layer Deposition (ALD) process which has excellent step coverage properties.

After the dielectric layer 19 is formed, a first top electrode layer 20 may be conformally formed over the dielectric layer 19. The first top electrode layer 20 may be formed in the cell region R10 and the peripheral circuit region R20. The first top electrode layer 20 may include the same material as that of the bottom electrodes 17. The first top electrode layer 20 may include a metal-based material. For example, the first top electrode layer 20 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide (RuO$_2$), iridium (Ir), an iridium oxide (IrO$_2$), platinum (Pt), or a combination thereof. The first top electrode layer 20 may be formed by performing a Low-Pressure Chemical Vapor Deposition (LPCVD) process, a Plasma Enhanced Chemical Vapor Deposition (PECVD) process, or an Atomic Layer Deposition (ALD) process. In this embodiment of the present invention, the first top electrode layer 20 may include a titanium nitride (ALD-TiN) formed through an ALD process.

A second top electrode layer 21 may be formed over the first top electrode layer 20. The second top electrode layer 21 may be formed in the cell region R10 and the peripheral circuit region R20. The second top electrode layer 21 may include a silicon-based material. The second top electrode layer 21 may include a silicon germanium layer. The second top electrode layer 21 may be formed through a Low-Pressure Chemical Vapor Deposition (LPCVD) process to have excellent step coverage properties. The second top electrode layer 21 may be formed thin to decrease the resistance of a top electrode.

A silicon germanium layer may be formed as the second top electrode layer 21 by using a silicon source and a germanium source.

Germane ($GeH_4$), digermane ($Ge_2H_6$), monochloro germane ($GeH_3Cl$), dichloro germane ($GeH_2Cl_2$), trichioro germane ($GeHCl_3$), tetrakisdimethylamino germane ($Ge(N(CH_3)_2)_4$) gas, or a combination thereof may be used as the germanium source.

A silicon source may include an organic silicon source or an inorganic silicon source. The organic silicon source may be an aminosilane-based compound. For example, the organic silicon source may be one selected from a group including diethylaminosilane (DEAS), diisopropylaminosilane (DIPAS), bis-diethylaminosilane (BDEAS), bis-isopropylaminosilane (BIPAS), bis-ethylmethylaminosilane (BEMAS), tris-dimethylaminosilane (TDMAS), and tris-isopropylaminosilane (TIPAS). The inorganic silicon source may include, for example, silane ($SiH_4$), monochloro silane ($SiH_3Cl$), dichloro silane ($SiH_2Cl_2$), trichloro silane ($SiHCl_3$), or silicon tetrachloride ($SiCl_4$). According to another embodiment of the present invention, two or more of the above-mentioned materials may be used as the inorganic silicon source.

According to another embodiment of the present invention, the silicon germanium layer may be doped with an impurity to have a conductivity. For example, the impurity may include an N-type impurity or a P-type impurity. The N-type impurity may include phosphorus (P) or arsenic (As), and the P-type impurity may include boron (B). The impurity may be doped through an in-situ doping process or an ex-situ doping process. For example, the impurity may be doped in-situ by supplying an impurity-containing gas while a silicon germanium layer is deposited. A P-type impurity-containing gas may include $BCl_3$ or $B_2H_6$. An N-type impurity-containing gas may include $PH_3$ or $AsH_3$. Also, after a silicon germanium layer is deposited, an impurity, such as boron (B), arsenic (As) and phosphorus (P) may be doped through an implantation process.

According to the present embodiment, the silicon germanium layer may be deposited by using $SiH_4/GeH_4/BCl_3$, such that the second top electrode layer 21 may include a boron (B)-doped silicon germanium (SiGe) layer.

Meanwhile, a minute amount of hydrogen may be included in the silicon germanium layer due to the sources used to deposit the silicon germanium layer. In the present embodiment, the amount of hydrogen included in the silicon germanium layer may be increased through a hydrogen plasma doping process 22 to be performed later.

Figure 6G:
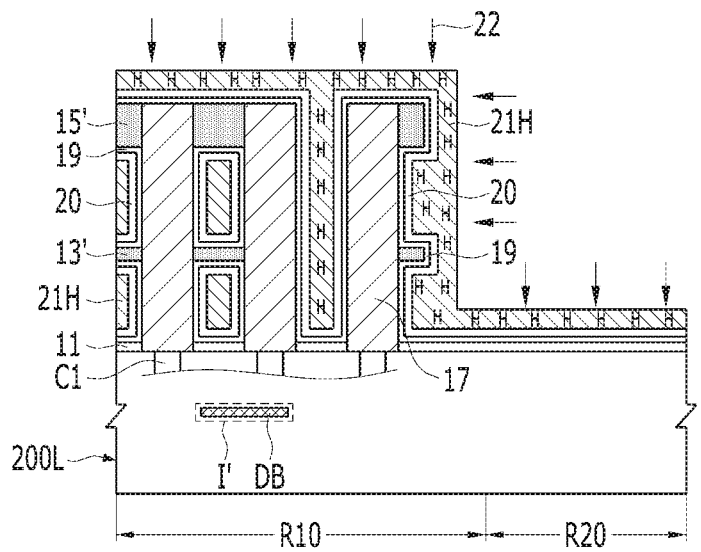

Referring to FIG. 6G, hydrogen (H) may be doped into the second top electrode layer 21. Hydrogen (H) may be doped through a plasma doping process. This is called 'a hydrogen plasma doping process ($H_2$ PLAD) 22'. Through the hydrogen plasma doping process 22, a high concentration-hydrogen (H) may be doped into the second top electrode layer 21. The second top electrode layer 21 doped with hydrogen may serve as a hydrogen supplying layer 21H. The hydrogen supplying layer 21H may enhance passivation by removing dangling bonds (DB). Hereafter, the second top electrode layer 21 doped with hydrogen may be simply referred to as 'a hydrogen-doped second top electrode layer 21H'. The hydrogen-doped second top electrode layer 21H' may be formed in the cell region R10 and the peripheral circuit region R20. Since the hydrogen plasma doping process 22 may be performed after the second top electrode layer 21 is formed, the dielectric layer 19 may not be attacked by the hydrogen plasma doping process 22.

The hydrogen plasma doping process 22 may use a hydrogen compound as a doping gas. For example, hydrogen ($H_2$) may be doped by a dose of approximately $3 \times 10^{16}$ atoms/$cm^2$ using an energy of approximately 3 KeV. In this embodiment of the present invention, the hydrogen-doped second top electrode layer 21H may include a silicon germanium layer doped with boron and hydrogen.

Figure 6H:
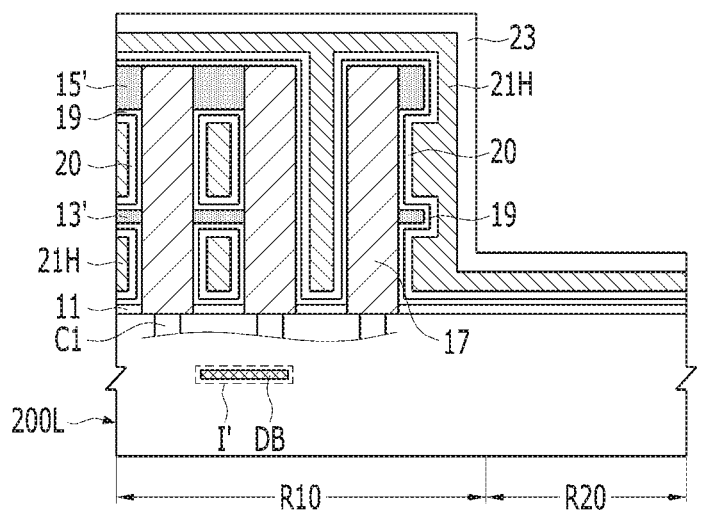

Referring to FIG. 6H, a third top electrode layer 23 may be formed over the hydrogen-doped second top electrode layer 21H'. The third top electrode layer 23 may include a metal-based material. The third top electrode layer 23 may include a material having a resistance lower than the resistances of the first top electrode layer 20 and the hydrogen-doped second top electrode layer 21H. The third top electrode layer 23 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), and a combination thereof. The third top electrode layer 23 may be formed by performing a Physical Vapor Deposition (PVD) process, a Low-Pressure Chemical Vapor Deposition (LPCVD) process, a Plasma Enhanced Chemical Vapor Deposition (PECVD) process, or an Atomic Layer Deposition (ALD) process. The third top electrode layer 23 may be deposited at a low temperature where a diffusion of hydrogen from the hydrogen-doped second top electrode layer 21H may be suppressed. In the present embodiment, the third top electrode layer 23 may include tungsten/tungsten nitride (W/WN) where a tungsten nitride and tungsten are sequentially stacked. The tungsten nitride may improve the adhesive force between the hydrogen-doped second top electrode layer 21H' and tungsten, and prevent the mutual diffusion between the hydrogen-doped second top electrode layer 21H' and the tungsten. The third top electrode layer 23 may be deposited at 400° C.

For the sake of convenience in description, although the hydrogen-doped second top electrode layer 21H' is illustrated to be thick, the first top electrode layer 20 and the third top electrode layer 23 may be thicker than the hydrogen-doped second top electrode layer 21H'. The thickness of the first top electrode layer 20 and the third top electrode layer 23, which are formed of a metal-based material may be increased to decrease their resistances.

Figure 6I:
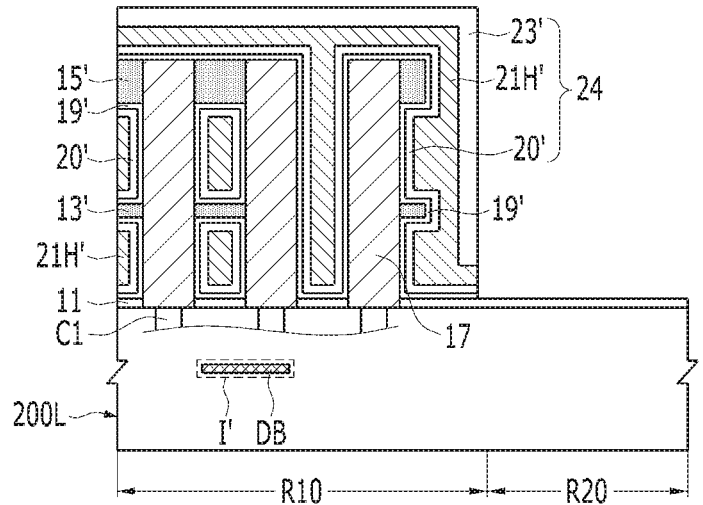

Referring to FIG. 6I, a top electrode patterning process may be performed. Through the top electrode patterning process, the third top electrode layer 23, the hydrogen-doped second top electrode layer 21H, and the first top electrode layer 20 may be etched. For example, the third top electrode layer 23, the hydrogen-doped second top electrode layer 21H, and the first top electrode layer 20 may be removed from the peripheral circuit region R20 by the top electrode patterning process. As a result, a third top electrode 23', a hydrogen-doped second top electrode 21H', and a first top electrode 20' may be formed. After the first top electrode layer 20 is etched, the dielectric layer 19 of the peripheral circuit region R20 may be etched. According to another embodiment of the present invention, the process of etching the dielectric layer 19 may be omitted.

The structure where the first top electrode 20', the hydrogen-doped second top electrode 21H', and the third top electrode 23' are stacked in the mentioned order may be referred to as a top electrode 24 or a plate PL.

The top electrode 24 including the third top electrode 23', the hydrogen-doped second top electrode 21H', and the first top electrode 20' may remain in the cell region R10. The third top electrode 23', the hydrogen-doped second top electrode 21H', and the first top electrode 20' may not be formed in the peripheral circuit region R20. A portion of the hydrogen-doped second top electrode 21H' may cover the sidewall of the bottom electrode 17 disposed at the outermost side. As a result, the distance between the hydrogen-doped second top electrode 21H' and the surface of the substrate may be reduced.

Figure 6J:
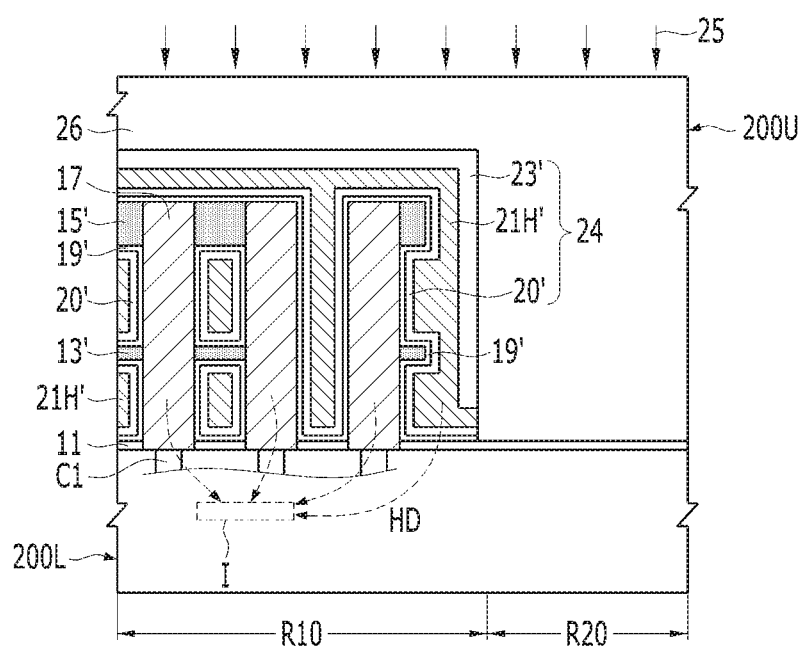

Referring to FIG. 6J, a hydrogen passivation process 25 may be performed. The hydrogen passivation process 25 may be performed in the atmosphere of a hydrogen-containing gas. The hydrogen passivation process 25 may include an annealing process. The hydrogen passivation process 25 may be performed in the atmosphere of $H_2N_2$. Before the hydrogen passivation process 25 is performed, a metal inter-layer dielectric layer 26 may be further formed. The metal inter-layer dielectric layer 26 may include a silicon oxide, such as TEOS. The metal inter-layer dielectric layer 26 may be formed in the cell region R10 and the peripheral circuit region R20. Therefore, the metal inter-layer dielectric layer 26 may cover the top electrode 24 of the cell region R10 and the etch stop layer 11 of the peripheral circuit region R20. Although not illustrated in the drawing, similarly to FIG. 5, the hydrogen passivation process 25 may be performed after a plurality of metal inter-layer dielectric layers and a plurality of metal lines are formed.

When the hydrogen passivation process 25 is performed, the hydrogen in the atmosphere of $H_2N_2$ may passivate the interface I'. Also, the hydrogen emitted from the hydrogen-doped second top electrode 21H' may passivate the interface I'. As described above, silicon dangling bonds (DB) existing in the interface I' may be removed through a double hydrogen passivation. After the hydrogen passivation process 25, a hydrogen-passivated interface I may be formed that is substantially free of silicon dangling bonds.

According to the present embodiment, the hydrogen-passivation efficiency may be increased by performing the hydrogen passivation process 25 in the presence of the hydrogen-doped second top electrode 21H' than when performing the hydrogen passivation process 25 without the hydrogen-doped second top electrode 21H'. Also, the time and procedural temperature for performing the hydrogen passivation process 25 may be decreased by forming the hydrogen-doped second top electrode 21H'.

Moreover, since the hydrogen-doped second top electrode 21H' is not formed in the peripheral circuit region R20, the peripheral transistors of the peripheral circuit region R20 may not be affected by the hydrogen-doped second top electrode 21H'. For example, hydrogen of the hydrogen-doped second top electrode 21H' may be diffused (refer to a reference symbol 'HD') along the boundary between the cell region R10 and the peripheral circuit region R20 to passivate the interface I'. Therefore, the dangling bonds (DB) formed in the cell region R10 may be removed while not affecting the peripheral transistors formed in the peripheral circuit region R20.

As described above, since the supply of hydrogen is enhanced through the hydrogen plasma doping process 22, the passivation efficiency of cell transistors may be increased without deteriorating the peripheral transistors. As a result, the data retention time tREF of the DRAM may be improved by more than at least approximately 10%.

According to a comparative example of the embodiments of the present invention, a $B_2H_6$ plasma doping process may be performed as the hydrogen plasma doping process 22. In this case, an unknown layer may be formed on the surface of the hydrogen-doped second top electrode 21H'. Due to the presence of the unknown layer, the hydrogen-doped second top electrode 21H' and the third top electrode layer 23 may come off. To remove the unknown layer, a cleaning process may be performed after the $B_2H_6$ plasma doping process is performed. Herein, hydrogen may get lost through the cleaning process. After all, the $B_2H_6$ plasma doping process may deteriorate the hydrogen passivation efficiency compared with the hydrogen plasma doping process.

According to a comparative example of the embodiments of the present invention, the silicon germanium layer may be doped with hydrogen through a hydrogen implantation process. However, the hydrogen implantation process may make the hydrogen contained in the silicon germanium layer distributed ununiformly. As a result, the hydrogen passivation efficiency may be deteriorated, compared with the hydrogen plasma doping process.

According to a comparative example of the embodiments of the present invention, a dielectric material containing hydrogen, e.g., a silicon nitride containing hydrogen, may be formed after the uppermost metal line is formed. However, since the hydrogen-containing silicon nitride is formed to cover the peripheral circuit region R20, the peripheral transistors of the peripheral circuit region R20 may be deteriorated. Also, since the distance between the hydrogen-containing silicon nitride and the surface of the substrate becomes longer, the temperature and time for performing the hydrogen passivation process may be increased.

According to a comparative example of the embodiments of the present invention, the etch stop layer 11 may be doped with hydrogen. However, the hydrogen may be diffused from the etch stop layer 11 into the peripheral transistors of the peripheral circuit region R20 through various processes performed after the etch stop layer 11 is formed. Meanwhile, since the etch stop layer 11 has to protect the peripheral circuit region R20 during a wet dip-out process for removing a mold layer and a top-electrode patterning process, the etch stop layer 11 should not be removed from the peripheral circuit region R20 before a capacitor is formed.

According to a comparative example of the embodiments of the present invention, the thickness of the silicon germanium layer may be increased without performing the hydrogen plasma doping process. The silicon germanium layer may contain hydrogen due to the source gases used for depositing the silicon germanium layer. When the thickness of the silicon germanium layer is increased, the amount of hydrogen contained in the silicon germanium layer may be increased. However, when the silicon germanium layer becomes thicker, its resistance may be increased. Also, the thick silicon germanium layer may become a burden when the top electrode is patterned later.

According to the embodiments of the present invention, a hydrogen passivation may be performed and the efficiency of the hydrogen passivation may be increased by simultaneously introducing a hydrogen-doped silicon germanium layer while performing the hydrogen passivation.

According to the embodiments of the present invention, the silicon dangling bonds of a memory cell region may be removed without deterioration of transistors in a peripheral circuit region by forming a hydrogen-doped silicon germanium layer when a top electrode of a capacitor is formed.

According to the embodiments of the present invention, the annealing temperature and the annealing time for performing the hydrogen passivation may be decreased by forming a hydrogen-doped silicon germanium layer.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising: a semiconductor substrate; a transistor formed in the semiconductor substrate; and a capacitor formed over the transistor, and including a bottom electrode, a dielectric layer, and a top electrode which are sequentially stacked, wherein the top electrode includes: a first top electrode; a hydrogen-doped second top electrode over the first top electrode; and a third top electrode over the hydrogen-doped second top electrode, wherein the hydrogen-doped second top electrode being positioned over the transistor to overlap with the transistor.

2. The semiconductor device of claim 1, wherein the hydrogen-doped second top electrode includes a hydrogen-doped silicon germanium layer.

3. The semiconductor device of claim 1, wherein the first top electrode and the third top electrode include a metal-containing material.

4. The semiconductor device of claim 1, wherein the transistor includes:
a gate trench formed in the semiconductor substrate;
a gate dielectric layer formed in the gate trench;
a gate electrode formed on the gate dielectric layer to fill the gate trench; and
an interface disposed between the semiconductor substrate and the gate dielectric layer and hydrogen-passivated by the hydrogen-doped second top electrode.

5. The semiconductor device of claim 1, wherein the semiconductor substrate includes a cell region and a peripheral circuit region, and
the hydrogen-doped second top electrode is disposed in the cell region and does not cover the peripheral circuit region.

* * * * *